United States Patent
Tsang

(10) Patent No.: US 8,084,728 B2
(45) Date of Patent: *Dec. 27, 2011

(54) OPTICAL SENSING DEVICE

(75) Inventor: Koon-Wing Tsang, Fremont, CA (US)

(73) Assignee: Capella Microsystems, Corp., Tortola (VG)

( * ) Notice: Subject to any disclaimer, the term of this patent is extended or adjusted under 35 U.S.C. 154(b) by 391 days.

This patent is subject to a terminal disclaimer.

(21) Appl. No.: 12/379,720

(22) Filed: Feb. 27, 2009

(65) Prior Publication Data

US 2009/0159785 A1 Jun. 25, 2009

Related U.S. Application Data

(63) Continuation-in-part of application No. 11/174,455, filed on Jul. 6, 2005, now Pat. No. 7,521,666.

(51) Int. Cl.
*H01J 40/14* (2006.01)
*H01L 27/00* (2006.01)

(52) U.S. Cl. .................. 250/208.1; 250/214.1; 250/226; 257/432; 359/359

(58) Field of Classification Search ............... 250/208.1, 250/214.1, 226; 257/431, 432; 359/359, 359/360; 348/272–275
See application file for complete search history.

(56) References Cited

U.S. PATENT DOCUMENTS

2003/0179383 A1* 9/2003 Chen et al. .................... 356/519
* cited by examiner

*Primary Examiner* — Kevin Pyo
(74) *Attorney, Agent, or Firm* — WPAT, P.C.; Anthony King

(57) ABSTRACT

The present invention discloses an optical sensing device with multiple photodiode elements and multi-cavity Fabry-Perot ambient light filter structure to detect and convert light signal with different wavelength spectrum into electrical signal. In embodiment, the optical sensing device capable of sensing color information of ambient light or sunlight and provides blocking of infrared (IR) light within the wavelength ranging from 700 nm to 1100 nm. Preferably, the optical sensing device senses not just the ambient light brightness but also the fundamental red, green and blue color components of the ambient light.

15 Claims, 7 Drawing Sheets

OPTICAL SENSING DEVICE

REFERENCE TO RELATED APPLICATIONS

This patent application is being filed as a Continuation-in-Part of patent application Ser. No. 11/174,455, filed on 6 Jul. 2005 now U.S. Pat. No. 7,521,666.

FIELD OF THE INVENTION

The present invention generally relates to an optical sensing device with multiple photodiode elements and multi-cavity Fabry-Perot ambient light filter structure to detect and convert light signal with different wavelength spectrum into electrical signal. More particularly, this invention relates to an optical sensing device capable of sensing color information of ambient light or sunlight and provides blocking of infrared (IR) light within the wavelength ranging from 700 nm to 1100 nm. The optical sensing device senses not just the ambient light brightness but also the fundamental red, green and blue color components of the ambient light.

BACKGROUND OF THE INVENTION

Ambient light sensors are now in widespread use, including cameras, camcorders, scanners, electrical microscopes, and so forth. The function of the ambient light sensors is to detect and convert ambient light brightness into electrical signal. For instance, knowing the brightness information of the ambient light, the display system brightness could be adjusted accordingly to reduce the power consumption of the backlight illumination. For most of the conventional ambient light sensor solutions, the sensor spectral response is not matched with the ideal human eye photometric response. The non-ideal ambient light sensor has a much wider spectral response range and also there are multiple peaks exhibited within the entire photodiode detection range of 400 nm to 1100 nm. Please refer to FIG. 1, which shows a chart of spectral response regarding the wavelength spectrum of a conventional ambient light sensor.

Generally, the human eyes are capable of sensing visible light within wavelength ranging between 400 nm and 700 nm. The response of the conventional ambient light sensor not only detect visible light in the range of wavelength spectrum like human eyes, but also captures infrared light with wavelength above 700 nm that human eye is unable to respond. Therefore, within the range between 700 nm and 1200 nm, two peaks 12 are produced without IR blocking according to the conventional ambient light sensor. Consequently, the inconsistency would be developed such that the human eye feels the ambient light is insufficient while, on the other hand, the conventional ambient light sensor senses sufficient ambient light. In other words, the ambient light sensor senses non-visible light that human eye is unable to response and the process for sensing non-visible light causes unnecessary backlight power consumption. For the reason, this invention provides a multi-cavity Fabry-Perot filter structure employs by utilizing the Fabry-Perot optical interference theory in order to effectively block the range from 700 nm to 1100 nm and reduce power consumption, thereby both brightness and color image processing adjustments are provided.

SUMMARY OF THE INVENTION

Therefore, it is one objective of the present invention to provide an optical sensing device. The optical sensing device comprises a substrate, a first photodiode, a second photodiode, at least one first Fabry-Perot cavity and at least one second Fabry-Perot cavity. The first photodiode and second photodiode are located the substrate. The first Fabry-Perot cavity covers the first photodiode, and the second Fabry-Perot cavity covers the second photodiode.

Preferably, each of the first Fabry-Perot cavity and the second Fabry-Perot cavity has two partially reflective layers and one interferometric layer sandwiching between the two partially reflective layers, and one of the two partially reflective layers of the first Fabry-Perot cavity is shared with the second Fabry-Perot cavity and thereby the first Fabry-Perot cavity stair stacks with the second Fabry-Perot cavity.

Preferably, the first Fabry-Perot cavity or the second Fabry-Perot cavity is capable of blocking the infrared (IR) light except for a wavelength spectrum that is recognizable for human eyes.

Preferably, the wavelength spectrum comprises a red-wavelength spectrum, a green-wavelength spectrum, a blue-wavelength spectrum, a cyan-wavelength spectrum, a magenta-wavelength spectrum and a yellow-wavelength spectrum.

It is another objective of the present invention to provide an optical sensing device which comprises a substrate, a plurality of first photodiodes, a second photodiode, a plurality of first Fabry-Perot cavities and at least one second Fabry-Perot cavity. The first photodiodes and the second photodiode are located the substrate. Each of the plurality of the first Fabry-Perot cavities covering one of a plurality of the first photodiodes, and each of the plurality of the first Fabry-Perot cavities has two first partially reflective layers and one first interferometric layer sandwiching between the two first partially reflective layers, and shares one of the two first partially reflective layers with a neighboring first Fabry-Perot cavity and thereby stair stacking with the neighboring first Fabry-Perot cavity. The second Fabry-Perot cavity covers the second photodiode, and has two second reflective layers and one interferometric layer sandwiching between the two second reflective layers.

Thus, the optical sensing device can effectively accomplish excellent IR blocking from non-visible light spectra and the typical transmittance of less than 2% for the entire IR range of 700 nm to 1100 nm. Furthermore, the green channel spectral response of the ambient light filter structure could well match with the spectral response of human eyes by utilizing the Fabry-Perot optical cavity.

DETAILED DESCRIPTION OF THE PREFERRED EMBODIMENTS

Figure 1:
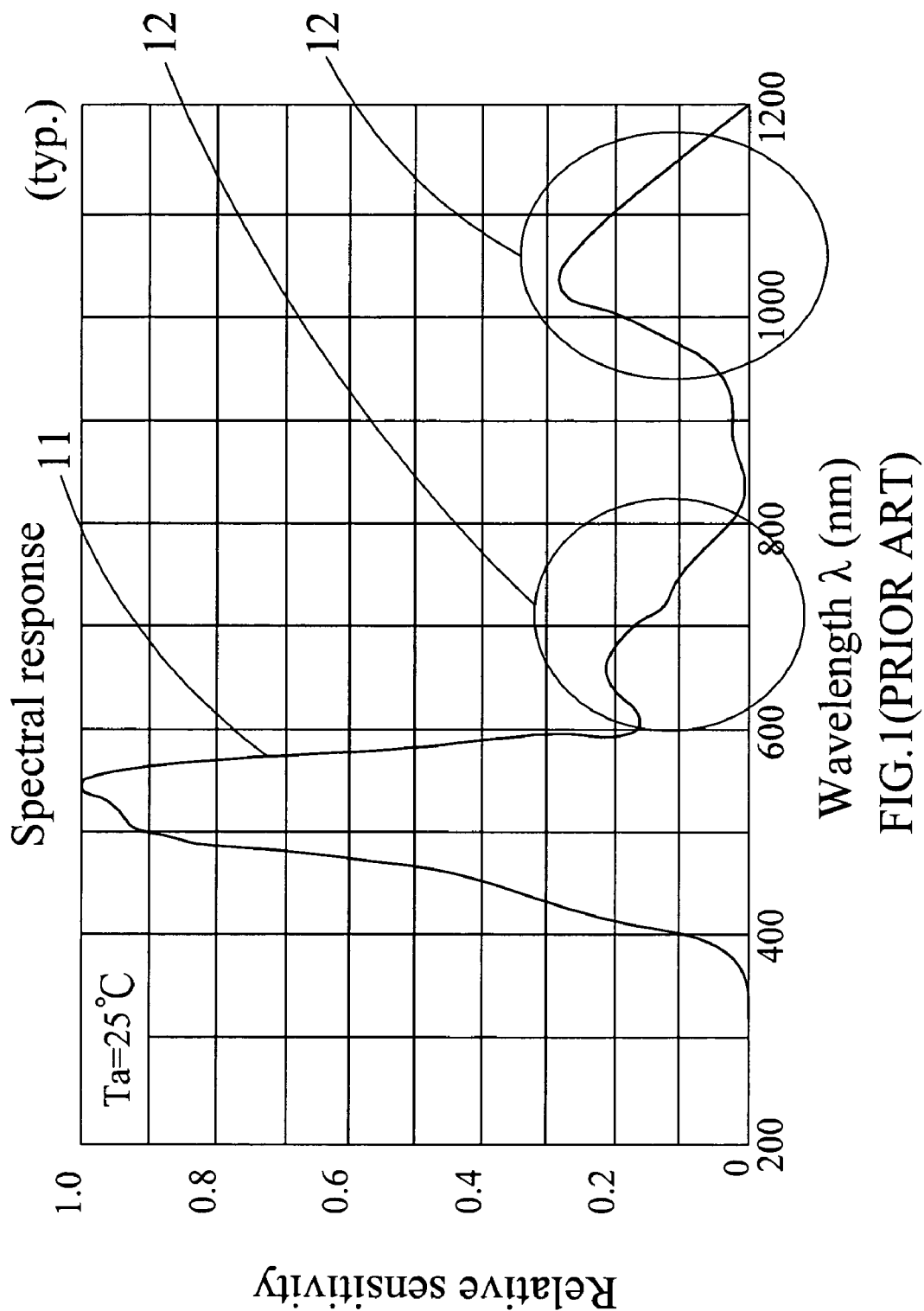
FIG. 1 is a chart of spectral response of a conventional ambient light sensor.

The preferred embodiments of the present invention will be explained below with reference to the drawing.

Figure 2:
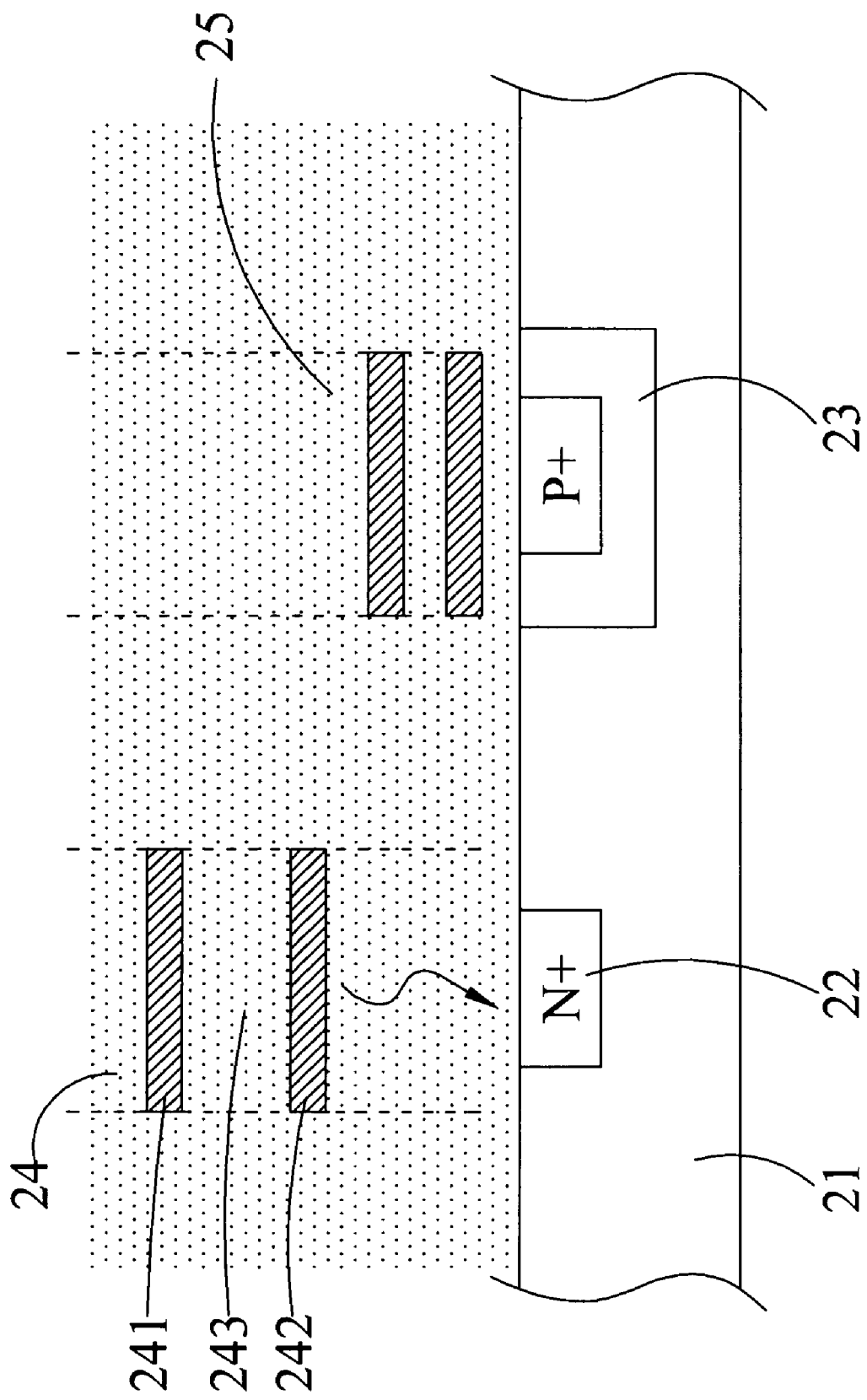
FIG. 2 is a cross-sectional diagram explaining an example of an optical sensing device according to an embodiment of the present invention.

FIG. 2 shows an example of an optical sensing device according to an embodiment of the present invention. The optical sensing device 2 comprises a substrate 21, a first photodiode 22, a second photodiode 23, at least one first Fabry-Perot cavity 24 and at least one second Fabry-Perot cavity 25. The first photodiode 22 and second photodiode 23 are located on the substrate 21. Preferably, the substrate 21 is a silicon substrate. The first Fabry-Perot cavity 24 or the second Fabry-Perot cavity 25 are used for bandpass filtering the light with determined wavelength, for example, infrared light or recognizable light for human eyes. Preferably, Each of the first Fabry-Perot cavity 24 and the second Fabry-Perot cavity 25 has two reflective layers 241, 242 and one interferometric layer 243 sandwiching between the two partially reflective layers 241, 242. Preferably, the reflective layer is a silver thin film or an aluminum thin film. Preferably, the interferometric layer is a silicon nitride thin film.

The first Fabry-Perot cavity 24 and the second Fabry-Perot cavity 25 are functioned as light filters, and their spectral responses varies based on the thicknesses of the interferometric layers or the material of the reflective layer. Therefore, the first photodiode 22 combined with first Fabry-Perot cavity 24 or the first photodiode 23 combined with first Fabry-Perot cavity 25 can be used as a color sensor, an ultra violet UV sensor, an IR sensor or an ambient light sensor according to Fabry-Perot cavity structure.

Figure 3:
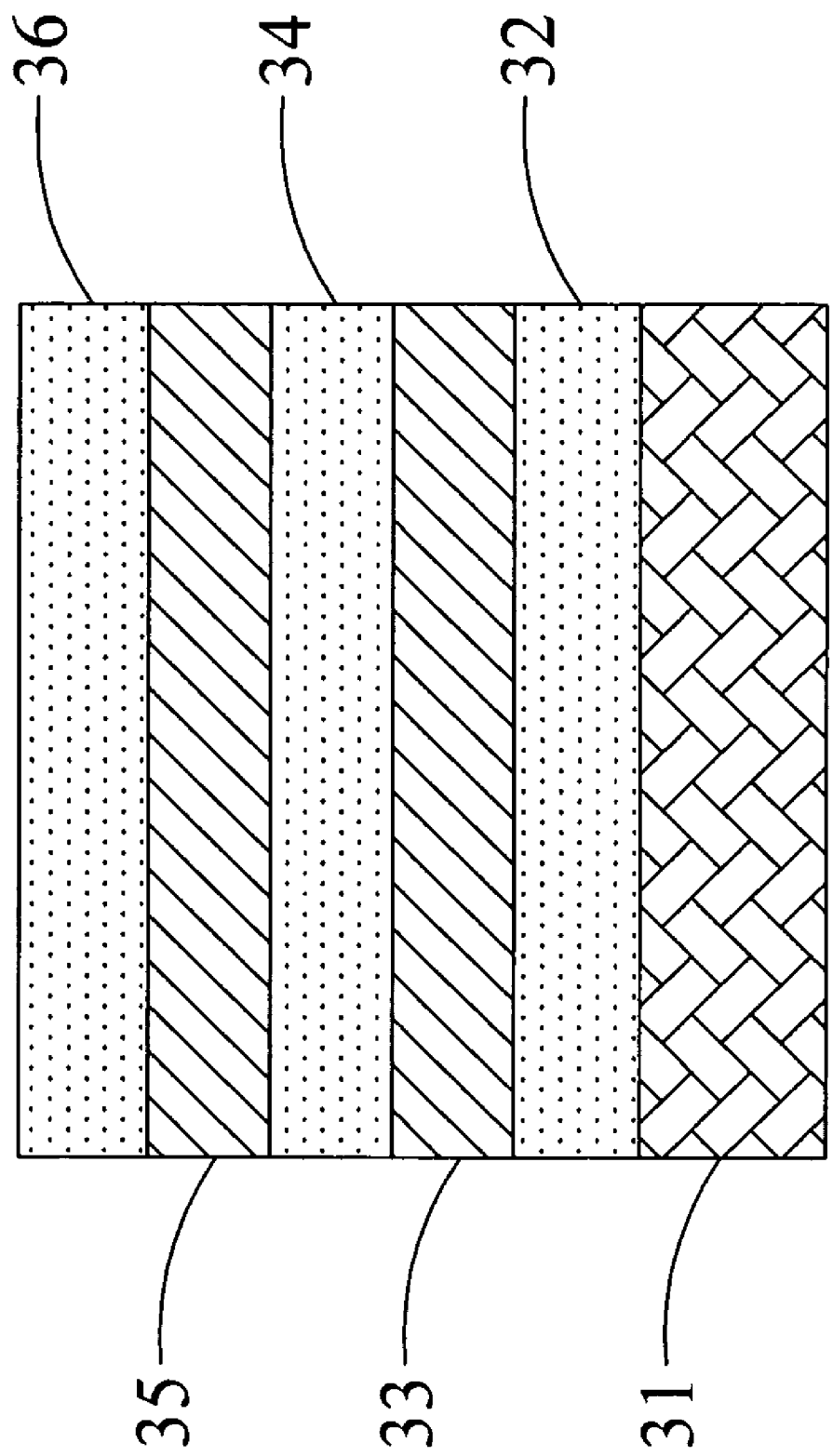
FIG. 3 is a cross-sectional diagram explaining an example of the composition of a single Fabry-Perot structure according to an embodiment of the present invention.

FIG. 3 shows an example of a Fabry-Perot cavity for filtering green light according to an embodiment of the present invention. The embodiment of Fabry-Perot cavity located on the a silicon substrate 31, comprises a first silicon nitride (Si3N4: 3200 Å±200) thin film layer 32, a first silver (Ag: 285 Å±35) partially reflective layer 33, a second silicon nitride (Si3N4: 920 Å±50) thin film layer 34, a second silver (Ag: 285 Å±35) reflective layer 35, and a third silicon nitride (Si3N4: 3500 Å±200) thin film layer 36. The preferred embodiment of the present invention has a P-type silicon substrate 31 which includes an array of N+ junction a photodiode element (not shown). On top of the N+/P-type photodiode, the first silicon nitride (Si3N4: 3200 Å±200) thin film layer 32 is deposited on the silicon substrate 31, the first silver (Ag: 285 Å±35) partially reflective layer 33 is deposited on the first silicon nitride thin film layer 32, the second silicon nitride (Si3N4: 920 Å±50) thin film layer 34 is deposited on the first silver partially reflective layer 33, the second silver (Ag: 285 Å±35) partially reflective layer 35 is deposited on the second silicon nitride thin film layer 34, and the third silicon nitride (Si3N4: 3500 Å±200) thin film layer 36 is deposited on the second silver partially reflective layer 35.

By way of the manufacturing process mentioned above, the single Fabry-Perot structure can be made and constitutes a simple five layers process plus the photodetector silicon substrate 31. The conventional all dielectric thin film photometric filters require forty-two layers of thin-film coating. The first silicon nitride thin film layer 32 is a bottom spacer layer, the first silver partially reflective layer 33 is a bottom partial reflector layer, the second silicon nitride thin film layer 34 is a center interferometric dielectric layer, the second silver partially reflective layer 35 is a top partial reflector layer, and the third silicon nitride thin film layer 36 is a top moisture protective layer. The second silicon nitride thin film layer 34 is a Fabry-Perot interferometric nitride layer, for filtering a certain spectral band of light, and a dielectric material such as silicon dioxide (SiO2) or oxy-nitride may be further applied thereon. The second silicon nitride thin film layer 34 can be shaped by Plasma Enhanced Chemical Vapor Deposition (PECVD). The first silver reflective layer 33, the second silicon nitride thin film layer 34, and the second silver reflective layer 35 are formed the core of the Fabry-Perot optical cavity. The first silicon nitride thin film layer 32 and the third silicon nitride thin film layer 36 are to protect the first silver reflective layer 33 and the second silver partially reflective layer 35 from moisture.

The ambient light filter structure can be made by the Complementary Metal Oxide Semiconductor (CMOS) technology, the bipolar technology, and the Bi-Complementary Metal Oxide Semiconductor (BiCMOS) technology. Furthermore, combining the single Fabry-Perot ambient light filter structure with a metal three light shield layer is to provide an effective stray light rejection structure for integrated electrical circuits (the metal three light shield layer is deposited between the silicon substrate). The design of the multi-cavity Fabry-Perot ambient light filter structure is based on the 1$^{st}$ order optical interference theory to provide an excellent IR blocking characteristic for wavelength of 700 nm to 1100 nm.

Next, the responses of the ambient light filter structure according to the present invention and the human eye will be explained with FIG. 4.

Figure 4:
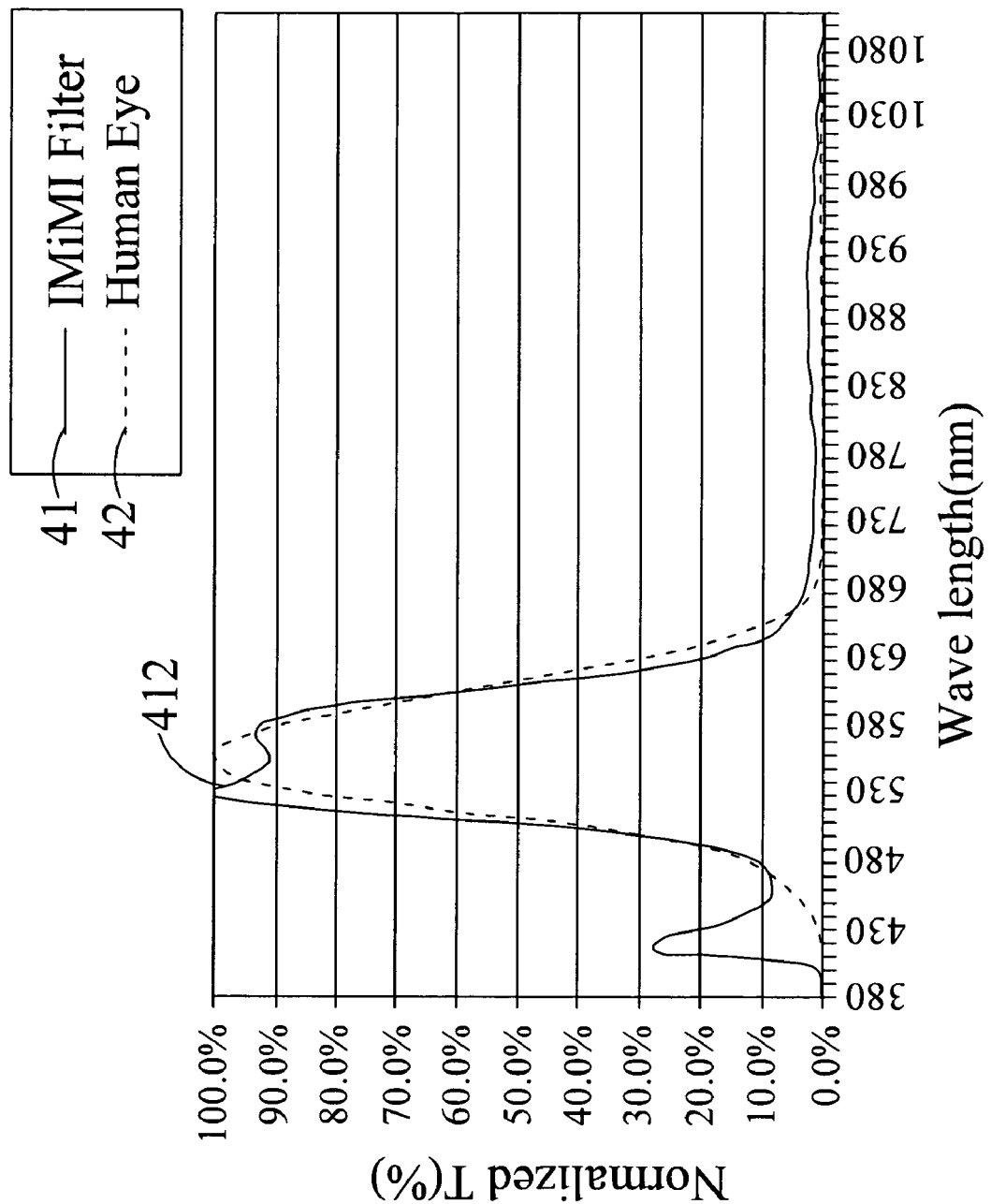
FIG. 4 is a chart of spectral responses explaining an example of the wavelength spectrum of the ambient light filter structure with IR blocking characteristics according to an embodiment of the present invention and human eyes.

As shown in FIG. 4, the chart introduces two responses, the first response 41 is the response of the ambient light filter structure according to the present invention and the second response 42 is that of the ideal human eye. Obviously, regarding the first response 41, the wavelength spectrum ranging from 700 nm to 1100 nm is effectively blocked by the ambient light filter structure and the response of the ambient light filter structure is proximate to the response of the ideal human eye at the range of 400 nm to 700 nm. The peak wavelength of the ambient light filter structure locates at around 555 nm 412. The spectral response of the ambient light filter structure substantially matches the response of the human eye.

Figure 5:
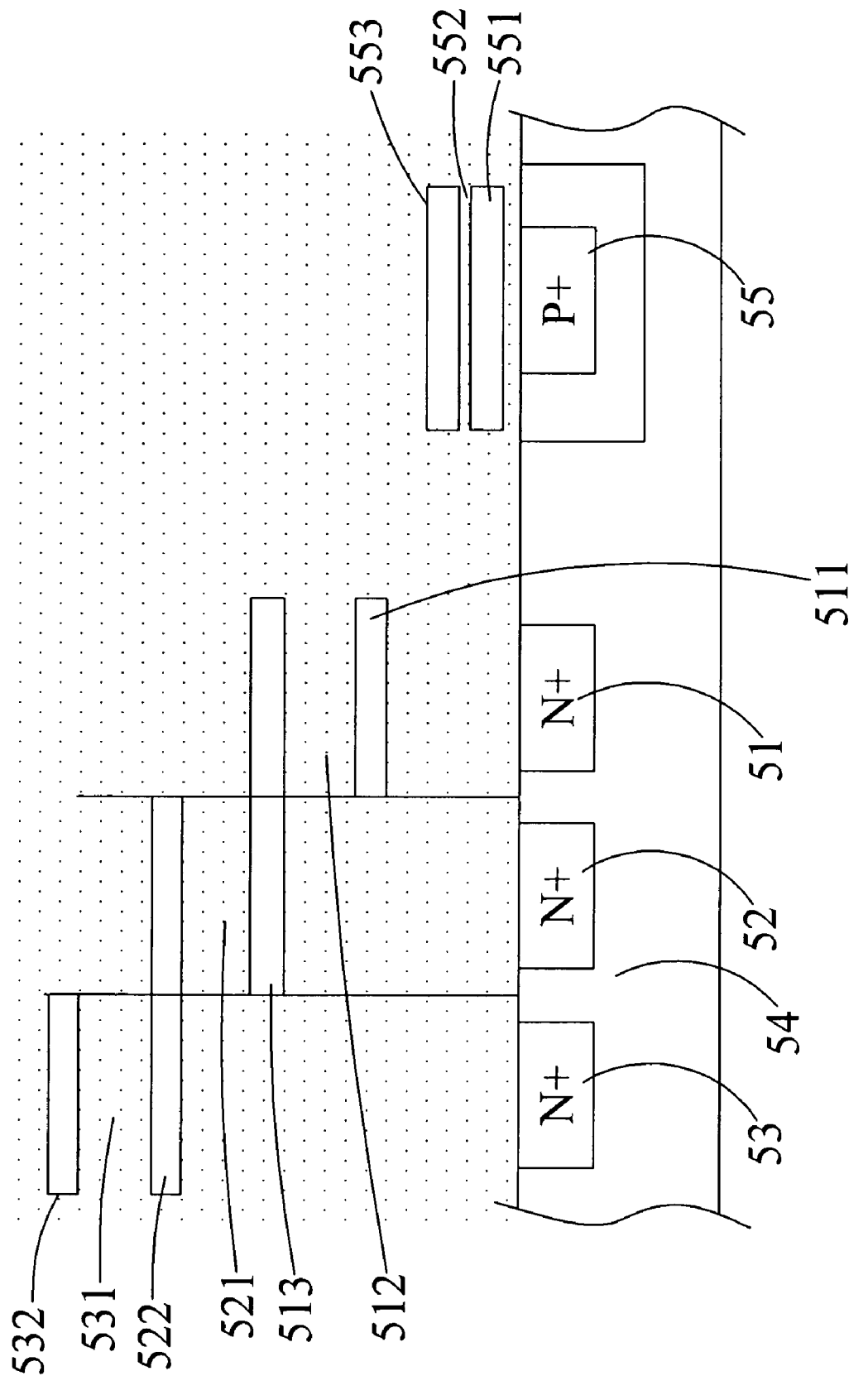
FIG. 5 is a cross-sectional diagram of an optical sensing device with a multi-cavity Fabry-Perot ambient light color filter stack structure and a single-cavity Fabry-Perot UV filter stack structure according to an embodiment of the present invention.

Next, an optical sensing device with a multi-cavity Fabry-Perot structure will be explained. FIG. 5 shows a cross-sectional diagram of an optical sensing device with a multi-cavity Fabry-Perot ambient light color filter stack structure and a single-cavity Fabry-Perot UV filter stack structure according to an embodiment of the present invention. The multi-cavity Fabry-Perot ambient light color filter stack structure is deposited on a photodiode array element 54 which comprises three photodiodes 51, 52, 53, such as the N+/P-substrate photodiodes shown in FIG. 5. The multi-cavity Fabry-Perot ambient light color filter stack structure comprises seven layers, they are: a first silver (Ag) partially reflective layer 511 deposited to cover the region of the first photodiode 51; a first silicon nitride (Si3N4) interferometric layer 512 deposited on the first silver partially reflective layer 511; a second silver (Ag) partially reflective layer 513 deposited the first silicon nitride interferometric layer 512 and the region of the second photodiode 52; a second silicon nitride (Si3N4) interferometric layer 521 deposited on the second silver partially reflective layer 513 to cover the region of the second photodiode 52; a third silver (Ag) partially reflective layer 522 deposited to cover both the second silicon nitride interferometric layer 521 and the region of the third photodiode 53; a third silicon nitride (Si3N4) interferometric layer 531 deposited on the third silver partially reflective layer 522 to cover the region of the third photodiode 53; and a fourth silver (Ag) partially reflective layer 532 deposited on the third silicon nitride interferometric layer 531. The first silver partially reflective layer 511, the first silicon nitride interferometric layer 512, and the second silver partially reflective layer 513 constitute a first Fabry-Perot optical cavity. The second silver partially reflective layer 513, the second silicon nitride interferometric layer 521, and the third silver partially reflective layer 522 constitute a second Fabry-Perot optical cavity. The third silver partially reflective layer 522, the third silicon nitride interferometric layer 531, and the fourth silver partially reflective layer 532 constitute a third Fabry-Perot optical cavity.

It should be noted that the second silver partially reflective layer 513 extends from the region of the first photodiode 51 to the region of the second photodiode 52; and the third silver partially reflective layer 522 extends from the region of the second photodiode 52 to the region of the third photodiode 53. In other words, the second sliver partially reflective layer 513 is a common Fabry-Perot reflector shared by the first photodiode 51 and the second photodiode 52; and the third silver partially reflective layer 522 is a common Fabry-Perot reflector shared by the second photodiode 52 and the third photodiode 53. The multi-cavity Fabry-Perot ambient light color filter stack structure can be made as a stair stack according to the present invention. The first silicon nitride interferometric layer 512, the second silicon nitride interferometric layer 521, and the third silicon nitride interferometric layer 531 are the interferometric center dielectric layer of the ambient light color filter structure. The deposition thickness of each silicon nitride interferometric layer may be implemented using the modern thin film deposition equipment, such as the Plasma Enhanced Chemical Vapor Deposition, which is a well controlled thickness deposition process. The seven layers of the ambient light color filter stack structure are usually used for three-color system.

The three-color system is a three fundamental color separation that human eye can recognize such as red, green, and blue. The aforementioned region of the first photodiode 51 may be implemented for capturing blue light, with a peak value near 450 nm in the wavelength spectrum. The aforementioned region of the second photodiode 52 may be implemented for capturing green light with a peak value near 550 nm in the wavelength spectrum. The aforementioned region of the third photodiode 53 may be implemented for capturing red light with a peak value near 650 nm in the wavelength spectrum. Furthermore, this type of seven layers of the ambient light color filter structure offers a modular flexible filter stack solution (the modular Fabry-Perot filter cell is formed by two silver partially reflective layers plus a silicon nitride interferometric layer and the silicon nitride interferometric layer is placed between two silver component layers) for any additional color filtering and detection. Each additional color filter cell requires only an extra modular Fabry-Perot filter stack masking layer and silicon nitride interferometric thickness layer deposition defines a specific optical passing spectrum. The partially reflective layer such as silver deposition and mask photo patterning process is based on either lift-off or dry etching process to define the modular filter regions.

Besides the three rectangles for capturing each fundamental color by the ambient light color filter structure, they may also be implemented to capture complementary color. For example, the complementary color includes cyan, magenta, and yellow.

In FIG. 5, the single-cavity Fabry-Perot UV filter stack structure is deposited on a photodiode 55 and comprises a first aluminum (Al) reflective layer 551, a silicon nitride (Si3N4) interferometric layer 552 deposited on the first aluminum (Al) reflective layer 551, and a second aluminum (Al) reflective layer 553 deposited on the silicon nitride interferometric layer 552, and is capable of blocking the light that human eye can recognize. Therefore, photodiode 55 combined with such single-cavity Fabry-Perot UV filter stack structure can be a UV sensor.

Figure 6:
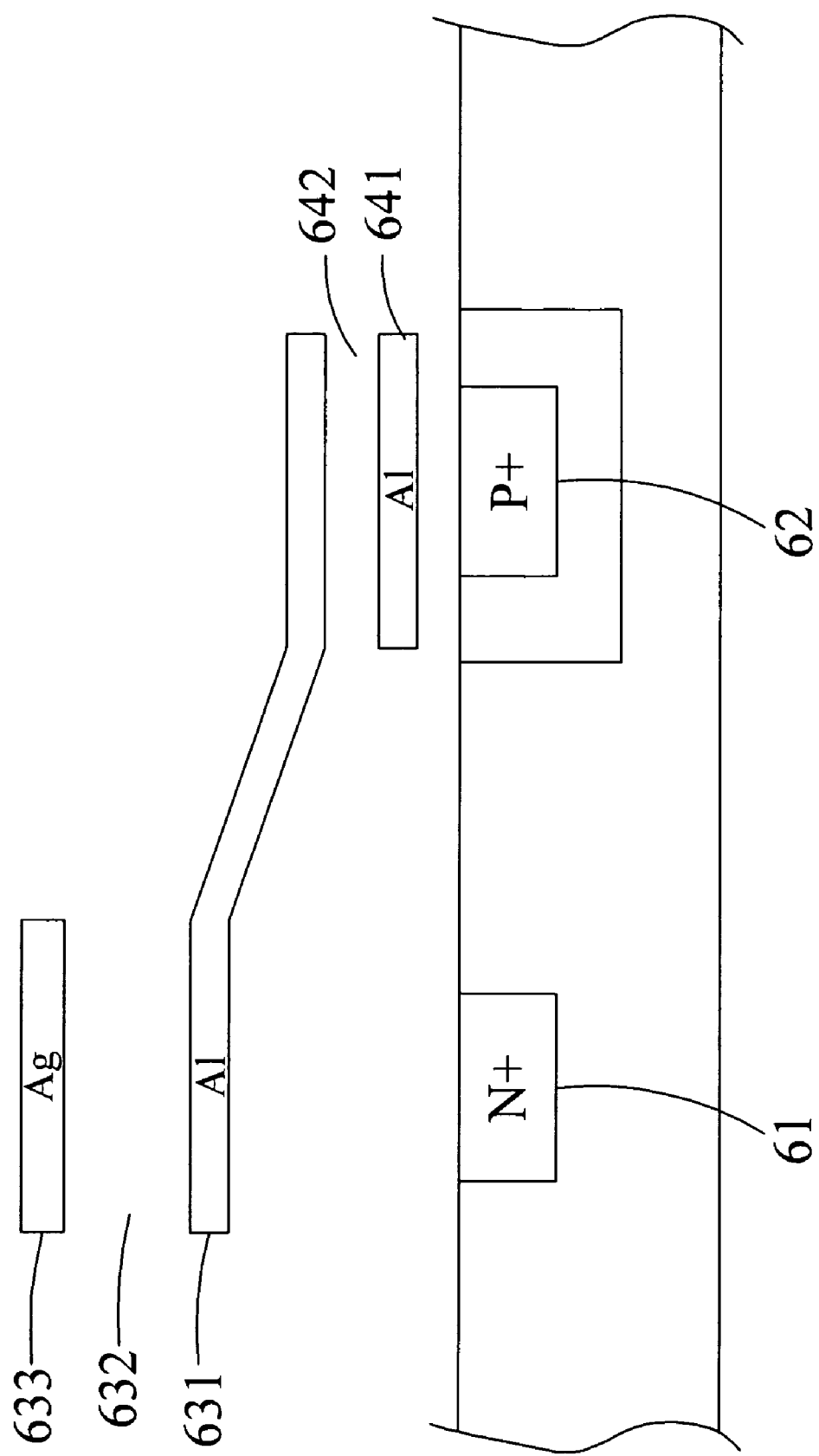
FIG. 6 is a cross-sectional diagram of example of an optical sensing device having two single-cavity Fabry-Perot filter stack structures according to an embodiment of the present invention.
Figure 7:
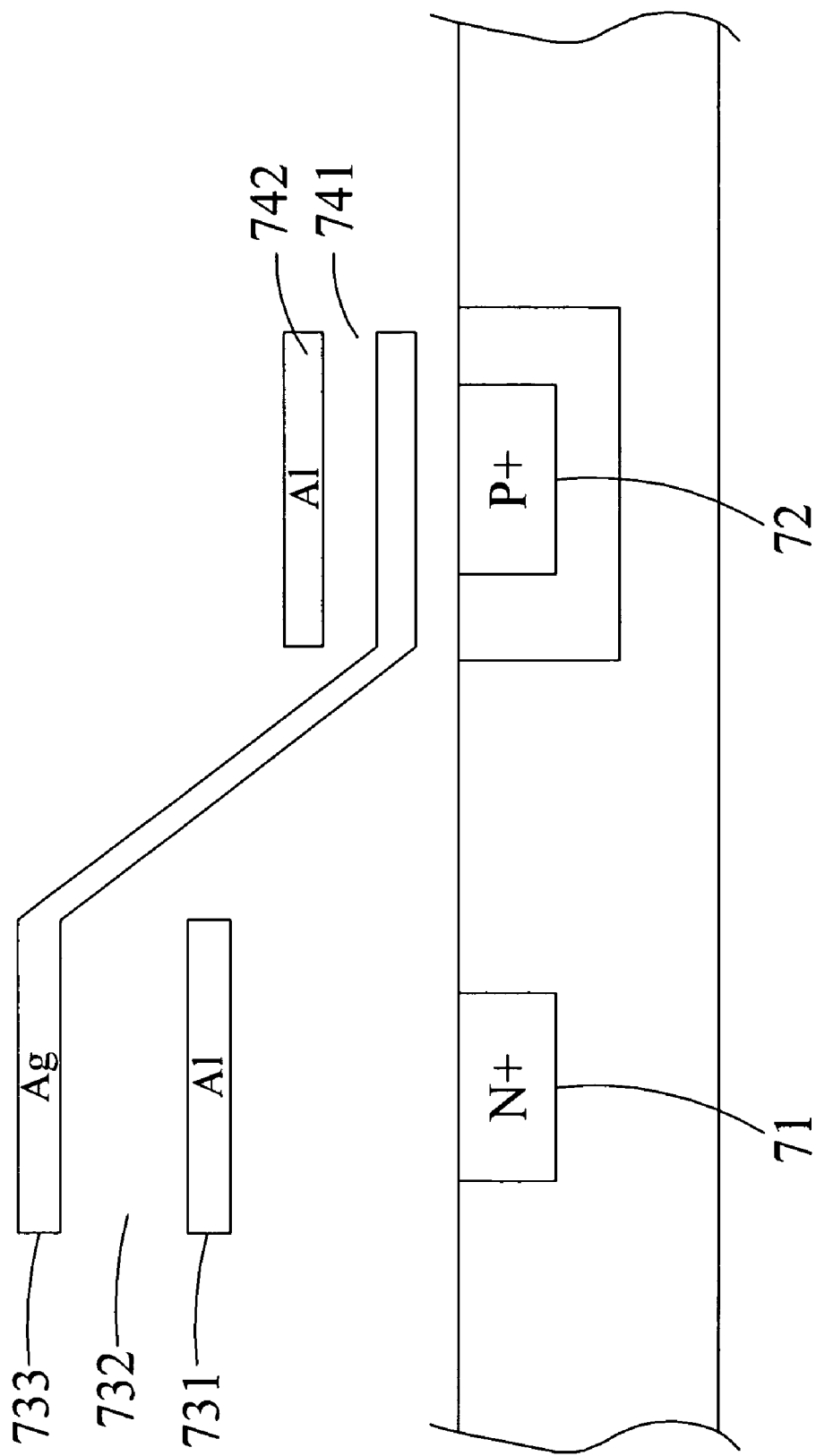
FIG. 7 is a cross-sectional diagram of other example of an optical sensing device having two single-cavity Fabry-Perot filter stack structures according to an embodiment of the present invention.

FIG. 6 and FIG. 7 show examples of an optical sensing device having two single-cavity Fabry-Perot filter stack structures according to an embodiment of the present invention. In these examples, two single-cavity Fabry-Perot filter stack structures can share a reflective layer. In FIG. 6, the aluminum (Al) reflective layer 631, the silicon nitride thin film layer 632, and the silver reflective layer 633 are formed the core of the first Fabry-Perot optical cavity, and the aluminum reflective layer 641, the silicon nitride thin film layer 642, and the aluminum reflective layer 631 are formed the core of the second Fabry-Perot optical cavity, it means that the aluminum reflective layer 631 is shared by two single-cavity Fabry-Perot filter stack structures. Therefore, the photodiode 61 combined with first Fabry-Perot optical cavity can be functioned as an ambient sensor, and the photodiode 62 combined with second Fabry-Perot optical cavity can be functioned as a UV sensor.

In other example as shown in FIG. 7, the aluminum (Al) reflective layer 731, the silicon nitride thin film layer 732, and the aluminum reflective layer 733 are formed the core of the first Fabry-Perot optical cavity, and the aluminum reflective layer 733, the silicon nitride thin film layer 741, and the aluminum reflective layer 742 are formed the core of the first Fabry-Perot optical cavity. Therefore, the photodiode 71 combined with first Fabry-Perot optical cavity can be functioned as an ambient sensor, and the photodiode 72 combined with second Fabry-Perot optical cavity can be functioned as a UV sensor.

In summation of the description above, the present invention of multi-cavity Fabry-Perot filter stack filter structure is novel and useful and definite enhances the performance over the conventional CMOS polymer based RGB filter and further complies with the patent application requirements and is submitted to the Patent and Trademark Office for review and granting of the commensurate patent rights.

What is claimed is:

1. An optical sensing device comprising:
   a substrate;
   a first photodiode located on the substrate;
   a second photodiode located on the substrate;
   at least one first Fabry-Perot cavity covering the first photodiode; and
   at least one second Fabry-Perot cavity covering the second photodiode;
   wherein each of the first Fabry-Perot cavity and the second Fabry-Perot cavity has two partially reflective layers and one interferometric layer sandwiching between the two partially reflective layers, and one of the two partially reflective layers of the first Fabry-Perot cavity is shared with the second Fabry-Perot cavity and thereby the first Fabry-Perot cavity stair stacks with the second Fabry-Perot cavity.

2. The optical sensing device of claim 1, wherein thicknesses of the interferometric layers are different from one another, thereby producing different spectral responses between the first Fabry-Perot cavity and the second Fabry-Perot cavity.

3. The optical sensing device of claim 1, wherein the first or the second Fabry-Perot cavity is capable of blocking the infrared light except for a wavelength spectrum that is recognizable for human eyes.

4. The optical sensing device of claim 3, wherein the wavelength spectrum comprises a red-wavelength spectrum, a green-wavelength spectrum, a blue-wavelength spectrum, a cyan-wavelength spectrum, a magenta-wavelength spectrum and a yellow-wavelength spectrum.

5. The optical sensing device of claim 1, wherein the partially reflective layer is a silver thin film or an aluminum thin film.

6. The optical sensing device of claim 1, wherein the interferometric layer is a silicon nitride thin film.

7. The optical sensing device of claim 6, wherein the silicon nitride is Si3N4.

8. The optical sensing device of claim 1, further comprising a bottom spacer layer deposited under each of the first Fabry-Perot cavity and the second Fabry-Perot cavity.

9. The optical sensing device of claim 1, wherein the optical sensing device is made in compliance with Complementary Metal Oxide Semiconductor (CMOS) technology, bipolar technology, or Bi-Complementary Metal Oxide Semiconductor (BiCMOS) technology.

10. An optical sensing device comprising:
a substrate;
a plurality of first photodiodes located the substrate;
a second photodiode located the substrate;
a plurality of first Fabry-Perot cavities, each of the plurality of the first Fabry-Perot cavities covering one of a plurality of the first photodiodes; and
at least one second Fabry-Perot cavity covering the second photodiode;
wherein each of the plurality of the first Fabry-Perot cavities has two first partially reflective layers and one first interferometric layer sandwiching between the two first partially reflective layers, and shares one of the two first partially reflective layers with a neighboring first Fabry-Perot cavity and thereby stair stacking with the neighboring first Fabry-Perot cavity;
wherein the second Fabry-Perot cavity has two second reflective layers and one interferometric layer sandwiching between the two second reflective layers.

11. The optical sensing device of claim 10, wherein a plurality of first Fabry-Perot cavities comprise:
a first partially reflective layer;
a second partially reflective layer;
a first interferometric layer deposited between the first partially reflective layer and the second partially reflective layer; and
a third partially reflective layer;
a fourth partially reflective layer; and
a second interferometric layer deposited between the third partially reflective layer and the fourth partially reflective layer;
wherein the second partially reflective layer and the third partially reflective layer share a first common partially reflective layer, and the first partially reflective layer and the fourth partially reflective layer are different partially reflective layers.

12. The optical sensing device of claim 11, wherein a plurality of first Fabry-Perot cavities further comprise:
a fifth partially reflective layer;
a sixth partially reflective layer; and
a third interferometric layer deposited between the fifth partially reflective layer and the sixth partially reflective layer;
wherein the fourth partially reflective layer and the fifth partially reflective layer share a second common partially reflective layer, and the third partially reflective layer and the sixth partially reflective layer are different partially reflective layers.

13. The optical sensing device of claim 10, wherein spectral responses of the first Fabry-Perot cavities and the second Fabry-Perot cavity are different.

14. The optical sensing device of claim 13, wherein the spectral responses of the first Fabry-Perot cavities comprises a red-wavelength spectrum, a green-wavelength spectrum, a blue-wavelength spectrum, a cyan-wavelength spectrum, a magenta-wavelength spectrum or a yellow-wavelength spectrum.

15. The optical sensing device of claim 11, wherein the first Fabry-Perot cavity, the second Fabry-Perot cavity are made in compliance with Complementary Metal Oxide Semiconductor (CMOS) technology, bipolar technology, or Bi-Complementary Metal Oxide Semiconductor (BiCMOS) technology.

* * * * *